(12) United States Patent
Kojima et al.

(10) Patent No.: US 8,129,857 B2
(45) Date of Patent: Mar. 6, 2012

(54) SEMICONDUCTOR CIRCUIT

(75) Inventors: Shoji Kojima, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 515 days.

(21) Appl. No.: 12/410,098

(22) Filed: Mar. 24, 2009

(65) Prior Publication Data

US 2009/0251001 A1 Oct. 8, 2009

(51) Int. Cl.
*H02J 1/00* (2006.01)
(52) U.S. Cl. .......................................... 307/18
(58) Field of Classification Search .............. 307/18; 702/69; 375/226; 713/320; 327/147, 164, 327/237, 291, 292; 326/93, 94
See application file for complete search history.

(56) References Cited

U.S. PATENT DOCUMENTS

| | | | | |
|---|---|---|---|---|
| 7,721,130 B2* | 5/2010 | Prete et al. | ...... | 713/323 |
| 2008/0056716 A1* | 3/2008 | Fujikawa | ...... | 398/45 |
| 2010/0060336 A1* | 3/2010 | Kojima et al. | ...... | 327/243 |

* cited by examiner

*Primary Examiner* — Jared Fureman
*Assistant Examiner* — Daniel Cavallari
(74) *Attorney, Agent, or Firm* — Martine Penilla Group, LLP

(57) ABSTRACT

A first signal processing circuit performs predetermined signal processing on a first signal to provide a change to a characteristic value thereof, and then outputs a second signal. A second signal processing circuit performs predetermined signal processing on the second signal to provide a change to a characteristic value thereof, and then outputs a third signal. A first and a second switching power supplies respectively supply power supply voltages to the first and second signal processing circuits. An amount of change provided to the characteristic value of the first signal by the first signal processing circuit, and an amount of change provided to the characteristic value of the second signal by the second signal processing circuit, are dependent on the respective power supply voltages. Phases of the first and the second switching power supplies are respectively set such that an error between the amount of change in the characteristic value of the first signal and its target value, and an error between that of the second signal and its target value, are to be canceled out by each other.

20 Claims, 4 Drawing Sheets

SEMICONDUCTOR CIRCUIT

CLAIM OF PRIORITY TO RELATED APPLICATION

The present application is claiming priority of Japanese Patent Application No. 2008-079234, filed on Mar. 25, 2008, the content of which is incorporated herein by reference.

BACKGROUND OF THE INVENTION

1. Field of the Invention

The present invention relates to a semiconductor circuit that performs certain signal processing on an input signal.

2. Description of the Related Art

Signal processing circuits, which perform certain signal processing on input signals to provide changes to characteristic values of the signals such as, for example, phase, amplitude and frequency characteristic and output the signals thus changed, are widely used for various semiconductor circuits (hereinafter, referred to as ICs). Examples of such signal processing circuits include delay circuit, amplifier, filter and the like.

With the recent progress in the semiconductor manufacturing process, an operating voltage of an IC is steadily on the decline, and now the IC operating at a power supply voltage of about 1.5 V is mainstream. As power supply circuits for supplying suitable power supply voltages to such ICs, switching regulators such as DC/DC converters, and series regulators (also referred to as "Low Drop Outputs (LDOs)") are used.

From the perspective of energy efficiency, a switching power supply is more advantageous than a linear regulator; however, a voltage generated by a switching power supply is superimposed with a ripple synchronized with a switching cycle of the power supply.

An amount of change provided to a characteristic value of a signal by the above signal processing circuit is sometimes dependent on a power supply voltage. For example, it is known that a delay amount of a delay circuit configured with multi-stage cascaded buffers (inverters) is influenced by the power supply voltage. If a power supply voltage for such a signal processing circuit is generated by the switching power supply, an amount of change provided to a characteristic value of the signal varies due to an influence by a ripple of the power supply voltage. That is, there occurs a problems that, in the case of a delay circuit, jitter is superimposed on a delay amount; and in the case of an amplifier, a ripple is superimposed on an amplitude of a signal.

SUMMARY OF THE INVENTION

The present invention has been made in view of these problems, and one of the purposes of the invention is to provide a semiconductor circuit in which the influence by the variation in a power supply voltage is suppressed.

The semiconductor circuit according to an embodiment of the present invention comprises: a first signal processing circuit that performs predetermined signal processing on a first signal to provide a change to a characteristic value thereof, and then outputs the signal as a second signal; a second signal processing circuit that performs predetermined signal processing on the second signal to provide a change to a characteristic value thereof, and then outputs the signal as a third signal; a first switching power supply that supplies a power supply voltage to the first signal processing circuit; and a second switching power supply that supplies a power supply voltage to the second signal processing circuit. An amount of change provided to the characteristic value of the first signal by the first signal processing circuit, and an amount of change provided to the characteristic value of the second signal by the second signal processing circuit, are dependent on the respective power supply voltages. Phases of the first switching power supply and the second switching power supply are set such that an error between the amount of change in the characteristic value of the first signal and its target value, and an error between that of the second signal and its target value, are to be canceled out by each other.

The "signal processing" means delay, amplification and filtering, etc., and the "characteristic value" refers to phase, amplitude and frequency, etc., of a signal. According to the embodiment, because two signal processing circuits are connected in series and each power supply voltage thereof is supplied by a different system, a variation in the characteristic value of the signal caused by a ripple of the power supply voltage can be suppressed by appropriately setting the phase of each switching power supply.

The first switching power supply and the second switching power supply may operate in phases opposite to each other. In this case, the power supply voltage generated by the first switching power supply and the power supply voltage generated by the second switching power supply, have ripples with phases opposite to each other. If amplitudes of the ripples are equal to each other, and a voltage sensitivity of the amount of change provided to the characteristic value of the first signal by the first signal processing circuit is equal to that provided by the second signal processing circuit, variations in the amounts of change in the respective characteristic values of the first and the second signal processing circuits are canceled out by each other. As a result, a ripple can be eliminated from an amount of change in the characteristic value of the whole signals, allowing the amount of change to be close to its target value.

Another embodiment of the present invention also relates to a semiconductor circuit. The semiconductor circuit comprises: a first signal processing circuit that performs predetermined signal processing on a first signal to provide a change to a characteristic value thereof, and then outputs the signal as a second signal; a second signal processing circuit that performs predetermined signal processing on the second signal to provide a change to a characteristic value thereof, and then outputs the signal as a third signal; a first switching power supply that supplies a power supply voltage to the first signal processing circuit, and a second switching power supply that supplies a power supply voltage to the second signal processing circuit. An amount of change provided to the characteristic value of the first signal by the first signal processing circuit, and an amount of change provided to the characteristic value of the second signal by the second signal processing circuit, are dependent on the respective power supply voltages. The first switching power supply and the second switching power supply operate in phases opposite to each other.

In this case, the power supply voltage generated by the first switching power supply and the power supply voltage generated by the second switching power supply, have ripples with phases opposite to each other. If amplitudes of the ripples are equal to each other, and a voltage sensitivity of the amount of change provided to the characteristic value of the first signal by the first signal processing circuit is equal to that provided by the second signal processing circuit, variations in the amounts of change provided to the respective characteristic values of the first and the second signal processing circuits are canceled out by each other. As a result, a ripple can be eliminated from an amount of change in the characteristic value of the whole signals, allowing the amount of change to be close to its target value.

Yet another embodiment of the present invention also relates to a semiconductor circuit. The semiconductor circuit comprises: a plurality of signal processing circuits that are connected in a cascade arrangement, each of which performs signal processing of the same type on an inputted signal to provide a change to the signal; and a plurality of switching power supplies provided for the respective signal processing circuits to supply a power supply voltage to the corresponding signal processing circuits. Amounts of change provided to characteristic values of signals by the plurality of signal processing circuits are dependent on the respective power supply voltages. Phases of the plurality of the switching power supplies are set such that a total of amounts of change provided to the characteristic values of signals by the plurality of the signal processing circuits is equal to its target value.

According to the embodiment, the influence on an amount of change provided to a characteristic value of a signal by a ripple of a power supply voltage can be reduced by appropriately setting the plurality of switching power supplies.

When there are n (n is an integer of two or more) pieces of signal processing circuits, each phase of the plurality of switching power supplies may be shifted by 360/n degree relative to each other. In this case, a variation in an amount of change provided to a characteristic value of a signal by a ripple of a power supply can be preferably suppressed.

The plurality of signal processing circuits may have the same configuration. In this case, voltage sensitivities of the amounts of change provided to the characteristic values of signals by the respective signal processing circuits can be made uniform, allowing a variation in an amount of change provided to a characteristic value of a signal caused by a ripple of a power supply voltage, to be suppressed.

Sensitivities of the amounts of change provided to characteristic values of signals by the plurality of signal processing circuits, respectively, on power supply voltages, may be approximately equal to each other. In this case, a variation in an amount of change provided to a characteristic value of a signal caused by a ripple of a power supply voltage can be suppressed.

The plurality of signal processing circuits may be delay circuits.

The plurality of signal processing circuits may also be amplifier circuits, or filters.

Yet another embodiment of the present invention relates to a test apparatus. The test apparatus comprises a signal processing circuit described in any one of the aforementioned embodiments, the signal processing circuit providing a delay to an inputted clock. By using this signal processing circuit, jitter in a delay amount provided to the clock can be suppressed, allowing the test accuracy to be enhanced.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
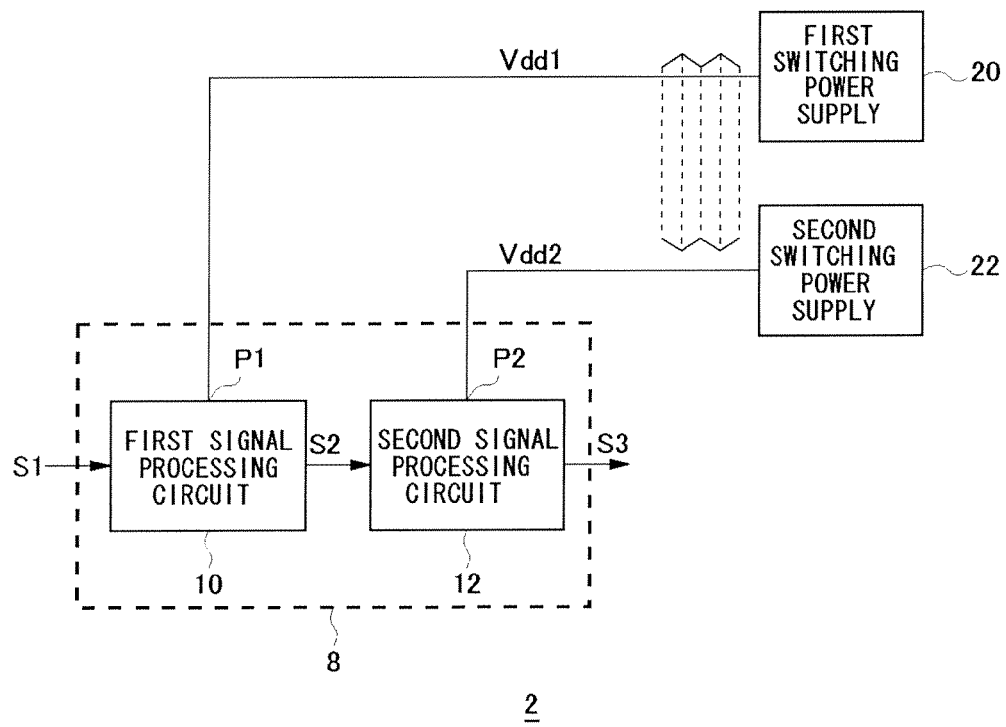
FIG. 1 is a block diagram illustrating the configuration of the semiconductor circuit according to an embodiment of the present invention.

FIG. 1 is a block diagram illustrating the configuration of the semiconductor circuit according to an embodiment of the present invention. The semiconductor circuit 2 performs as a whole predetermined signal processing on an input signal S1 to generate an output signal S3. A content of the signal processing is not limited, but at least one of characteristic values of the input signal S1 is provided with a change. For example, if the signal processing is delay processing, a phase (timing at the edge) of the input signal S1, a characteristic value of the signal, is provided with a change. Besides, if the signal processing is amplification processing, an amplitude of the input signal S1, another characteristic value of the signal, is provided with a change. If the signal processing is filtering processing, a frequency characteristic of the input signal S1 is provided with a change. The present technique is also applicable to various signal processing, which are not exemplified herein.

The semiconductor circuit 2 comprises a signal processing circuit 8, a first switching power supply 20, and a second switching power supply 22.

The signal processing circuit 8 performs predetermined processing on the input signal S1 to generate an output signal S3. The signal processing circuit 8 includes a first signal processing circuit 10 and a second signal processing circuit 12. The first signal processing circuit 10 performs predetermined signal processing on a first signal S1, an input signal for the whole semiconductor circuit 2, to provide a change to a characteristic value thereof, and then outputs the signal as a second signal S2. The second signal processing circuit 12 performs predetermined signal processing on the second signal S2 to provide a change to a characteristic value thereof, and then outputs the signal as a third signal S3. The third signal S3 is an output signal of the whole semiconductor circuit 2.

That is, the signal processing circuit 8 includes the first signal processing circuit 10 and the second signal processing circuit 12 that are connected in a cascade arrangement, and performs desired signal processing on the input signal S1 in two stages.

For the purpose of facilitating understanding of the present invention, a specific description thereof will be made below, taking the case where the signal processing is "delay" processing as an example. The first signal S1 is, for example, a pulse signal, and the semiconductor circuit 2 provides as a whole a predetermined delay amount τ to the first signal S1.

It is assumed that an amount of change provided to the characteristic value of the first signal S1 (namely, phase) by the first signal processing circuit 10 is described as τ1, and an amount of change provided to that of the second signal S2 (namely, phase) by the second signal processing circuit 12 is described as τ2. That is, the semiconductor circuit 2 provides a predetermined delay amount τ by dividing it into two stages, providing the delay amount τ1 in the first stage by the first signal processing circuit 10 and the delay amount τ2 in the second stage by the second signal processing circuit 12. Herein, τ=τ1+τ2 is held.

The first signal processing circuit 10 and the second signal processing circuit 12 comprise independent power supply terminals P1 and P2, respectively, allowing separate power supply voltages Vdd1 and Vdd2 to be supplied. The first switching power supply 20 supplies the power supply voltage Vdd1 to the first signal processing circuit 10 and the second switching power supply 22 provides the power supply voltage Vdd2 to the second signal processing circuit 12.

Figure 2:
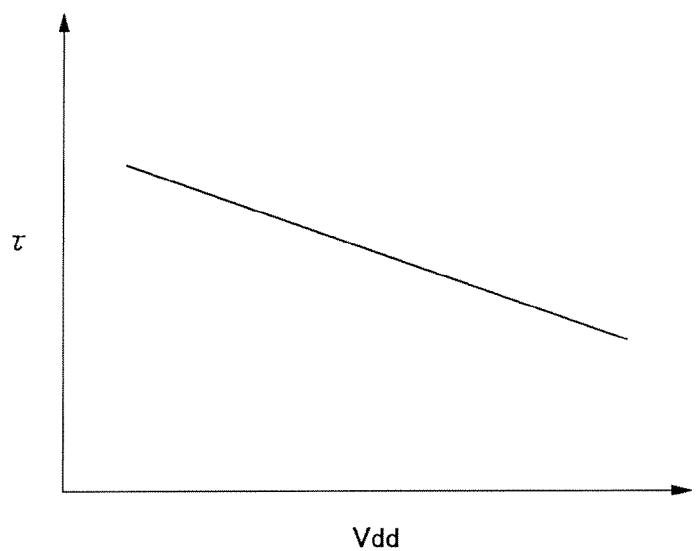
FIG. 2 is a graph illustrating the dependency of a delay amount provided by the first signal processing circuit and the second signal processing circuit, which are delay circuits, on a power supply voltage.

The amount of change (namely, delay amount τ1) provided to the characteristic value (phase) of the first signal S1 by the first signal processing circuit 10 is dependent on the power supply voltage Vdd1. Likewise, the amount of change (delay amount τ2) provided to that of the second signal S2 by the second signal processing circuit 12 is dependent on the power supply voltage Vdd2. FIG. 2 is a graph illustrating the dependency of a delay amount provided by the first signal processing circuit 10 and the second signal processing circuit 12, which are delay circuits, on the power supply voltage.

The plurality of signal processing circuits 10 and 12 preferably have the same configuration. In this case, voltage sensitivities (dτ/dVdd) of the amounts of change (τ1 τ2) provided to the characteristic values of the signals by the plurality of signal processing circuits, respectively, can be made uniform, allowing the effect of canceling out an error, which will be described later, to be enhanced. Alternatively, the plurality of signal processing circuits 10 and 12 may have different configurations.

For example, if the first signal processing circuit 10 and the second signal processing circuit 12 are configured with multi-stage cascaded inverters, respectively, the delay amounts τ1 and τ2 vary dependently on the power supply voltages Vdd1 and Vdd2. Specifically, as the power supply voltages are higher, the delay amounts are smaller. If the first signal processing circuit 10 and the second signal processing circuit 12 are amplifier circuits, gains thereof are to be dependent on the power supply voltages.

The first switching power supply 20 and the second switching power supply 22 may be a switching regulator of a synchronous rectification type or a diode rectification type, or a switching regulator using a transformer. Alternatively, if a current capability is sufficient, the two switching power supplies 20 and 22 may use a combination of a charge pump circuit and a series regulator in which an input voltage for the charge pump is adjusted by feedback control. These circuits are generally used, and hence the description thereof will be omitted.

A switching regulator turns on or off a switching element to switch a current supplied to a coil or a transformer. In the case of a general step-down switching regulator, magnetic energy is stored by applying an input voltage to the coil during on-period of the switching element, while output capacitor is charged by an induced current of the coil during off-period thereof. An output voltage of a power supply is stabilized at a target value by adjusting a time ratio (duty ratio) of on-time to off-time of the switching element. In order to stabilize the output voltage, the duty ratio of the switching element is controlled by the Pulse Width Modulation (PWM) method or the Pulse Frequency Modulation (PFM) method, etc.

At a macroscopic level, the output voltage of the switching regulator is stabilized at a target value; however, in fact, a ripple synchronized with the on and off of the switching element is present. Namely, the output voltage is increased because the output capacitor is charged during on-time of the switching element, while is decreased because that is discharged by a load current during off-time thereof. A ripple of the output voltage appears due to repetition of the phenomena.

As stated above, the delay amounts τ1 and τ2 provided to signals by the first signal processing circuit 10 and the second signal processing circuit 12 vary in accordance with the power supply voltages Vdd1 and Vdd2, respectively. Namely, the delay amounts periodically vary in accordance with the ripples of the power supply voltages Vdd1 and Vdd2.

In the semiconductor circuit 2 according to the present embodiment, the first switching power supply 20 and the second switching power supply 22 perform switching operations in different phases from each other. Specifically, phases φ1 and φ2 of the first switching power supply 20 and the second switching power supply 22 are set such that an error Δτ1 (=τ1−πt1) between the delay amount τ1 provided to the first signal S1 and its target value τt1, and an error Δτ2 (=τ2−τt2) between the delay amount τ2 provided to the second signal S2 and its target value τt2, are canceled out by each other.

In order to most readily cancel out the errors Δτ1 and Δτ2, the first switching power supply 20 and the second switching power supply 22 may be operated in phases opposite to each other. As a method for controlling the first switching power supply 20 and the second switching power supply 22, for example, the following method is typically cited.

That is, an error voltage is generated by amplifying an error between an output voltage of the switching regulator and its target value. And subsequently, the error voltage is compared with a periodic voltage of a saw-tooth wave or a triangle wave, etc., and then is sliced. On and off of the switching element is controlled by using a pulse obtained by slicing the error voltage.

In the case where a control circuit of such PWM method is used, phases of the switching operations can be made opposite to each other by shifting the phases of the triangle wave or the saw-tooth wave generated inside the circuit by 180 degree between the first switching power supply 20 and the second switching power supply 22.

In addition, in the case where a control circuit of a type in which set and reset of a flip-flop is repeated by using a clock with a predetermined frequency, the phases of the clock may be inverted between the first switching power supply 20 side and the second switching power supply 22 side.

Figure 3:
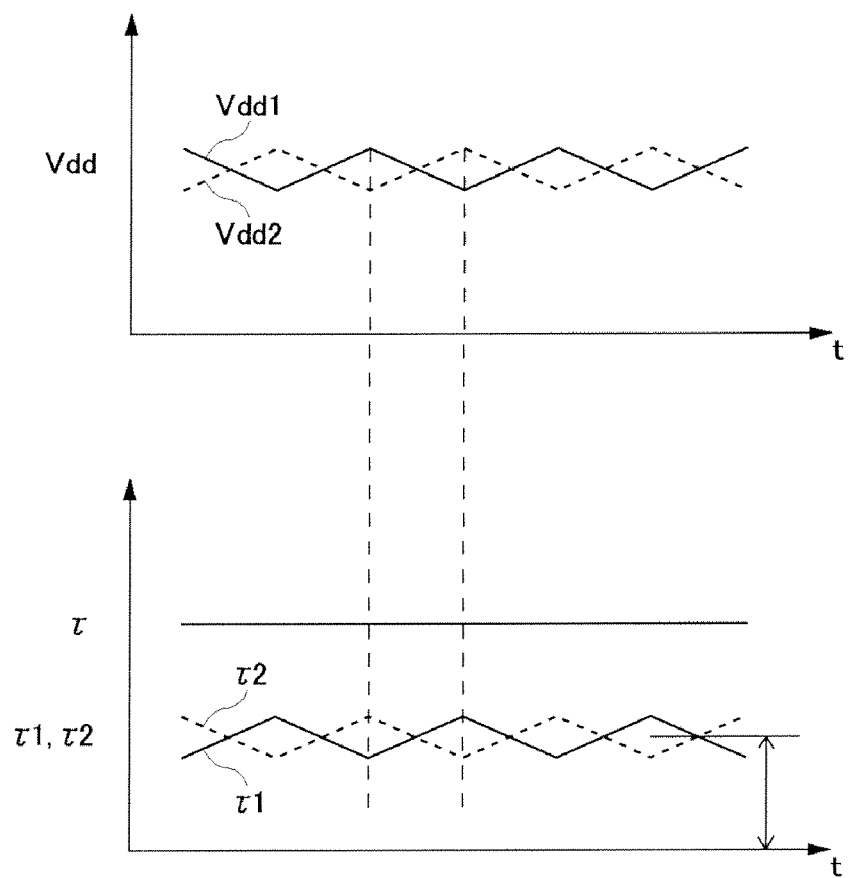
FIG. 3 is time charts illustrating performance of the semiconductor circuit in FIG. 1.

The description with respect to the configuration of the semiconductor circuit 2 has been made above. Subsequently, the performance of the semiconductor circuit 2 will be described. FIG. 3 is time charts illustrating performance of the semiconductor circuit 2 in FIG. 1. The upper chart in the drawing illustrates the power supply voltages Vdd1 and Vdd2, while the lower one illustrates the delay amount τ1 provided by the first signal processing circuit 10, the delay amount τ2 provided by the second signal processing circuit 12, and the total delay amount τ provided by the whole semiconductor circuit 2.

The power supply voltages Vdd1 and Vdd2 are equally regulated to the same value; however, because the two voltages are switched in phases opposite to each other, ripples with polarities opposite to each other appear. It is assumed that a voltage sensitivity (dτ1/dVdd1) of the delay amount τ1 provided by the first switching power supply 20, and a voltage sensitivity (dτ2/dVdd2) of the delay amount τ2 provided by the second switching power supply 22, are equal. It is also assumed that amplitudes ΔVdd1 and Vdd2 of the ripples of the power supply voltages Vdd1 and Vdd2 are equal.

Because the delay amount τ of the whole semiconductor circuit 2 is a total of τ1 and τ2, τ=τ1+τ2=τt1+Δ1+Δτ2 is held. The delay amounts τ1 and τ2 vary in phases opposite to each other in accordance with the ripples of the corresponding power supply voltages; hence, the errors Δτ1 and Δτ2 with the respective target values τt1 and τt2 have signs opposite to each other. As a result, the errors Δτ1 and Δτ2 are balanced out by each other, allowing variation of the delay amount τ due to an influence by the ripple of the power supply voltage to be suppressed, thereby allowing the delay amount τ to be stabilized at the target value of τt1+t2.

As stated above, the two errors Δτ1 and Δτ2 can be canceled out by each other by inverting the phases of the first switching power supply 20 and the second switching power supply 22.

The power supply voltages Vdd1 and Vdd2 are not necessarily required to have phases opposite to each other. Namely, the phases φ1 and φ2 for stabilizing the delay amount τ of the whole semiconductor circuit 2, may also be set more finely by optimizing the phases through experiments or simulations.

With reference to the time charts in FIG. 3, the case where the duty ratios of switching of the first switching power supply 20 and the second switching power supply 22 are equally 50% has been described; however, a duty ratio is usually determined in accordance with an input voltage and an output voltage of a switching power supply, and therefore the ratio is not necessarily limited to 50%. However, when the duty ratio is not 50%, the delay amount τ of the whole semiconductor circuit 2 can be stabilized by optimizing the phases of the first switching power supply 20 and the second switching power supply 22, allowing a sufficient effect to be obtained.

In addition, according to the semiconductor circuit 2 in FIG. 1, a feed back control for approaching the amount of change provided to the characteristic value to its target value, is not needed; hence, it can be prevented that the operation of the circuit is unstable due to an oscillation phenomenon, etc. There is also an advantage that an open-loop system can be more readily designed than a feedback system (closed-loop system).

The aforementioned semiconductor circuit 2 has been described with respect to the case where the circuit has two-stage delay circuits; however, the present invention can be extended to signal processing circuits with any number of stages that is equal to or more than three. In this case, a variation in the whole delay amount can be suppressed by shifting the phases of power supply voltages supplied to a plurality of signal processing circuits to each other. Of course, the semiconductor circuit according to the invention can be applied to the processing other than the delay processing, even if the semiconductor circuit has equal to or more than three stages.

That is, the following technological thought can be derived from the semiconductor circuit 2. Namely, the semiconductor circuit (100) comprises a plurality of signal processing circuits (10, 12) and a plurality of switching power supplies (20, 22).

The plurality of signal processing circuits (10, 12) are connected in a cascade arrangement, each of which performs the same type of signal processing on an inputted signal to provide a change to a characteristic value thereof. The plurality of switching power supplies (20, 22) are provided for every plurality of signal processing circuits (10, 12) to supply power supply voltages (Vdd1, Vdd2) to the corresponding signal processing circuits (10, 12).

Amounts of change (τ1, τ2) provided to the characteristic values (i.e., phases) of the signals (S1, S2) by the plurality of signal processing circuits (10, 12), respectively, are dependent on the power supply voltages (Vdd1, Vdd2). The phases of switching of the plurality of switching power supplies (20, 22) are set such that a total (τ=τ1+τ2) of the amounts of change (τ1, τ2) provided to the characteristic values of the signals by the plurality of signal processing circuits (10, 12) is to be equal to its target value.

According to the technological thought, an amount of change provided to the characteristic value, which is necessary as a whole, is divided into any pieces n. In order to preferably eliminate an influence by the ripples of power supply voltages, it is preferable that the amount of change is equally divided into n pieces; however, each amount of change does not necessarily have to be the same, and an overall amount of change only has to be canceled out.

When there are n (n is an integer of two or more) pieces of signal processing circuits, each phase of the plurality of switching power supplies may be shifted by 360/n degree relative to each other. In this case, an influence by the ripples of power supply voltages can be readily canceled out by each other.

In the aforementioned embodiment, the description has been made with respect to the case where: voltage sensitivities of amounts of change provided to the characteristic values of signals by a plurality of signal processing circuits, respectively, on power supply voltages, are equal to each other; and the ripple amplitude ΔVdd1 and ΔVdd2 of the power supply voltages supplied to the respective signal processing circuits are equal to each other. Namely, the following equations (1) and (2) are held in the case:

$$d\tau1/dVdd1=d\tau2/dVdd2 \quad (1)$$

$$\Delta Vdd1=\Delta Vdd2 \quad (2)$$

The ripple amplitude Δτ1 and Δτ2 of the amounts of change provided to the characteristic values of signals are determined by multiplying the variation amplitude ΔVdd of the power supply voltage Vdd by the sensitivity of the amount of change provided to the characteristic value. Therefore, under the condition of equations (1) and (2), the following equation (3) is held:

$$d\tau1/dVdd1 \times \Delta Vdd1 = d\tau2/dVdd2 \times \Delta Vdd2 \quad (3)$$

Hence, the variation in an amount of change provided to the characteristic value could be preferably canceled out.

However, if the equations (1) and (2) are not held at the same time, an influence by the ripple of a power supply voltage can be preferably eliminated with the equation (3) held. Further, even if the right term and the left term of the equation (3) are different from each other, an influence by the ripple of a power supply voltage can be suppressed when the values of the both terms are close to each other, allowing the advantages of the present technique to be obtained.

The description has been made above with respect to the semiconductor circuit 2 according to the embodiment. Subsequently, applications suitable for the semiconductor circuit 2 will be described. The semiconductor circuit 2 can be used in a semiconductor test apparatus (hereinafter, simply referred to as a test apparatus) 100.

Delay circuits are used in various portions within the test apparatus 100, and the semiconductor circuit 2 in FIG. 1 can be preferably adopted in such delay circuits.

Figure 4:
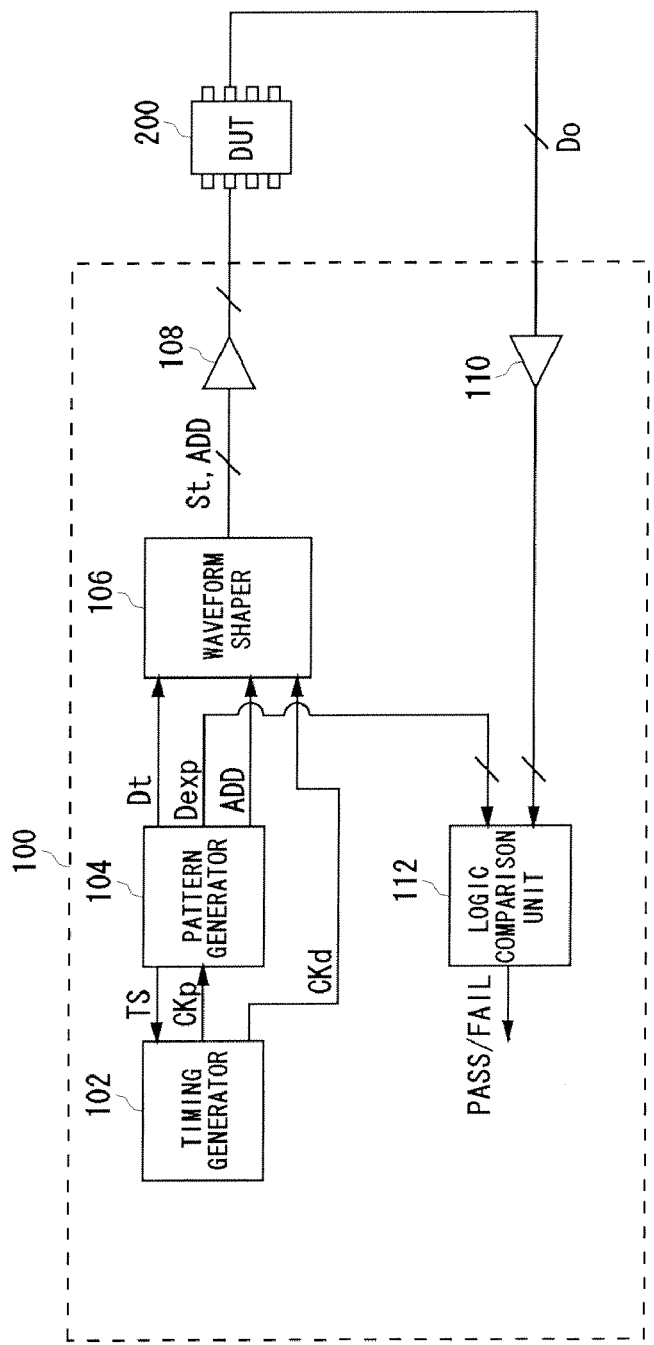
FIG. 4 is a block diagram illustrating the configuration of the test apparatus according to the embodiment.

FIG. 4 is a block diagram illustrating the configuration example of the test apparatus 100 according to the embodiment. The test apparatus 100 determines whether the data to be tested outputted from the DUT 200 is consistent with the expected value. The DUT is, for example, a memory.

The test apparatus 100 comprises a timing generator 102, a pattern generator 104, a waveform shaper 106, a write driver 108, a comparator 110, and a logic comparison unit 112.

The pattern generator 104 generates a timing-set signal (hereinafter, referred to as a "TS signal") and supplies it to the timing generator 102. The timing generator 102 generates a periodic clock CKp and a delay clock CKd based on the timing data specified by the TS signal, and supplies the periodic clock CKp to the pattern generator 104 and the delay clock CKd to the waveform shaper 106, respectively. The pattern generator 104 generates addresses ADD indicating each of the blocks, which are a plurality of memory areas the DUT 200 has, and a plurality of test pattern data items Dt that are to be written in each of the plurality of blocks, and supplies them to the waveform shaper 106.

The waveform shaper 106 generates a test pattern signal St corresponding to the test pattern data Dt generated by the pattern generator 104, based on the delay clock CKd supplied by the timing generator 102. The waveform shaper 106 supplies the addresses ADD, which are supplied by the pattern generator 104, and the test pattern signal St thus generated to the DUT 200 via the write driver 108.

The pattern generator 104 generates in advance expectation data Dexp, data to be outputted by the DUT 200 in accordance with the addresses ADD and the test pattern signal St, and supplies the data to the logic comparison unit 112.

The comparator 110 receives from the DUT 200 the data Do corresponding to the addresses ADD and outputs it to the logic comparison unit 112. The logic comparison unit 112 compares the data Do read from the DUT 200 with the expectation data Dexp supplied by the pattern generator 104, such that it is determined whether the DUT 200 is good.

Figure 5A:
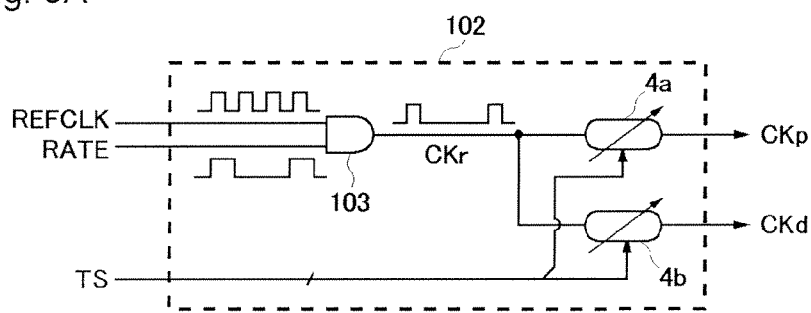
FIGS. 5A and 5B are block diagrams illustrating a configuration of a timing generator.
Figure 5B:
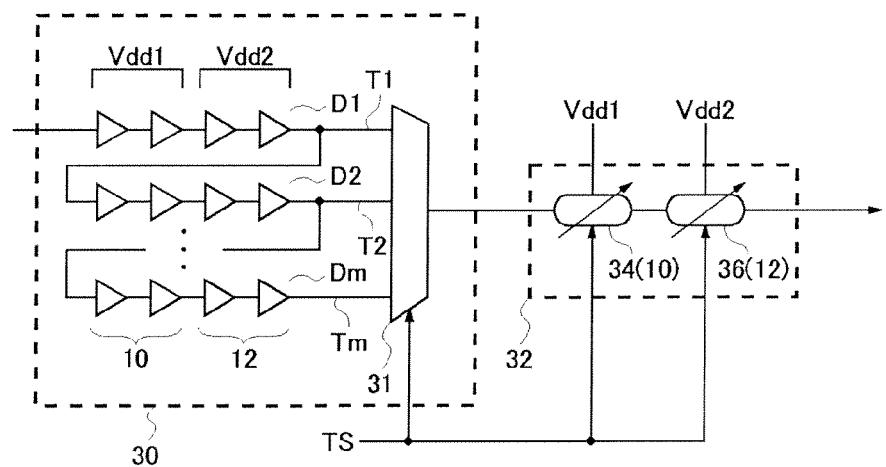

FIGS. 5A and 5B are block diagrams illustrating a configuration of the timing generator 102. FIG. 5A illustrates the configuration of the timing generator 102, and FIG. 5B illustrates a configuration example of the delay circuit used in the timing generator. As illustrated in FIG. 5A, the timing generator 102 comprises: a pulse selection unit 103 that takes out a pulse corresponding to a test rate from the reference clock REFCLK with a frequency of several hundred MHz; and delay circuits 4a and 4b that delay the selected pulse.

The reference clock REFCLK and a pulse signal (hereinafter, refereed to as a rate signal RATE) with a lower frequency than the reference clock REFCLK, are inputted to the pulse selection unit 103. The functions of the pulse selection unit 103 can be simply represented by an AND gate, and takes out the edge of the reference clock REFCLK with a window set by the rate signal RATE. A pulse CKr with a frequency corresponding to the test rate is outputted from the pulse selection unit 103.

The delay circuits 4a and 4b provide a delay corresponding to the TS signal to the output CKr outputted from the pulse selection unit 103, and generate the periodic clock CKp and the delay clock CKd. The technique for stabilizing a delay of the semiconductor circuit 2 according to the embodiment is applied to at least one of the delay circuits 4a and 4b, preferably to both of them.

As illustrated in FIG. 5B, the delay circuits 4a and 4b comprise a prepositive delay circuit 30 provided in the preceding stage and a postpositive delay circuit 32 provided in the subsequent stage. The delay circuits 4a and 4b provide the whole variable delay of 0 to 2 ns to the pulse CKr, respectively. The prepositive delay circuit 30 provides a course delay at several-ns order intervals; and the postpositive delay circuit 32 provides a fine delay at several tens-ps order intervals.

The technique of the semiconductor circuit 2 described with reference to FIG. 1 is applicable to either the prepositive delay circuit 30 or the postpositive delay circuit 32.

The prepositive delay circuit 30 comprises multiple m pieces (m is an integer) of sub-delay circuits D1 to Dm and a selector 31. The sub-delay circuits D1 to Dm are connected in a cascade arrangement, each of which provides a predetermined delay amount $\tau d1$ to $\tau dm$, respectively. Taps T1 to Tm are provided in connection nodes of the sub-delay circuits D1 to Dm. From the ith tap, a pulse receiving a synthesized delay $\Sigma \tau di$ in which delay amounts $\tau 1$ to $\tau i$ of the 1st stage to the ith stage are summed up, is outputted. The selector 31 selects any one of pulses generated in the plurality of taps in accordance with the TS signal.

Each of the sub-delay circuits D1 to Dm corresponds to the semiconductor circuit 2 in FIG. 1; hence, the sub-delay circuits D1 to Dm are divided into the first signal processing circuit 10 and the second signal processing circuit 12, respectively. In FIG. 5B, the sub-delay circuits D1 to Dm are respectively configured to include multi-stage cascaded delay elements. The first signal processing circuit 10 includes delay elements in the preceding stage, and the second signal processing circuit 12 includes delay elements in the subsequent stage. The delay element in the preceding stage included in the first signal processing circuit 10 receives the power supply voltage Vdd1 from the first switching power supply 20 in FIG. 1, and the delay element in the subsequent stage included in the second signal processing circuit 12 receives the power supply voltage Vdd2 from the second switching power supply 22 in FIG. 1.

According to the prepositive delay circuit 30, the influence provided to the respective delay amounts $\tau d1$ to $\tau dm$ of the sub-delay circuits D1 to Dm by the ripples of the power supply voltages, can be suppressed.

The postpositive delay circuit 32 in the subsequent stage has also the configuration corresponding to the semiconductor circuit 2 in FIG. 1. That is, the postpositive delay circuit 32 is configured to be divided into a first sub-delay circuit 34 and a second sub-delay circuit 36. The first sub-delay circuit 34 corresponds to the first signal processing circuit 10 in FIG. 1, and the second sub-delay circuit 36 corresponds to the second signal processing circuit 12 in FIG. 1. Also, the configurations of the first sub-delay circuit 34 and the second sub-delay circuit 36 are not particularly limited, but may be configured to include a plurality of multi-stage cascaded delay elements and to be capable of switching the number of the stages of the delay elements in accordance with the TS signal. Alternatively, the first and second sub-delay circuits 34 and 36 may be configured to be capable of adjusting biases of the delay elements.

Also, by configuring the postpositive delay circuit 32 in the same way as the semiconductor circuit 2 in FIG. 1, jitter in delay amounts in the first sub-delay circuit 34 and the second sub-delay circuit 36, which occur due to the ripples of the power supply voltages, can be canceled out.

The test apparatus 100 is required to have higher timing accuracy than a general electronic device and a semiconductor circuit. In particular, the jitter in the timing generator 102 has a great impact on the test accuracy, and hence it should be suppressed as much as possible. In a conventional test apparatus, a linear regulator capable of generating a ripple-free power supply voltage is generally used in order to suppress jitter in the timing generator 102. However, efficiency of the linear regulator is significantly inferior to that of the switching regulator; hence, a very large quantity of electric power is consumed in a test apparatus using the linear regulator.

Alternatively, when intending to use a switching power supply as a power supply circuit in a conventional test apparatus, it can be considered that a filter is provided in a supply path of the power supply voltage in order to eliminate the ripple of the power supply voltage. In this case, however, there occurs a subsidiary problem that, when the load of the power supply circuit varies, a spike or a dip is generated in the power supply voltage in accordance with the load variation. Such swing of the power supply voltage also appears as jitter in a delay mount.

By applying the semiconductor circuit 2 according to the embodiment to various delay circuits within the test apparatus 100, the electric power consumption can be reduced by using a switching power supply in a power supply circuit, and further a jitter-free signal can be preferably generated.

While the preferred embodiments of the present invention have been described using specific terms, such description is for illustrative purposes only, and it is to be understood that changes and variations may be made without departing from the spirit or scope of the appended claims.

What is claimed is:

1. A semiconductor circuit comprising:
    a first signal processing circuit that performs predetermined signal processing on a first signal to provide a change to a characteristic value thereof, and then outputs the signal as a second signal;
    a second signal processing circuit that performs predetermined signal processing on the second signal to provide a change to a characteristic value thereof, and then outputs the signal as a third signal;
    a first switching power supply that supplies a power supply voltage to the first signal processing circuit; and
    a second switching power supply that supplies a power supply voltage to the second signal processing circuit, wherein an amount of change provided to the characteristic value of the first signal by the first signal processing circuit, and an amount of change provided to the characteristic value of the second signal by the second signal processing circuit, are dependent on the respective power supply voltages, and wherein phases of the first switching power supply and the second switching power supply are set such that an error between the amount of change in the characteristic value of the first signal and its target value, and an error between that of the second signal and its target value, are to be canceled out by each other.

2. The semiconductor circuit according to claim 1, wherein the first switching power supply and the second switching power supply operate in phases opposite to each other.

3. The semiconductor circuit according to claim 1, wherein the plurality of signal processing circuits have the same configuration.

4. The semiconductor circuit according to claim 1, wherein sensitivities of the amounts of change provided to characteristic values of signals by the plurality of signal processing circuits, respectively, on power supply voltages, are approximately equal to each other.

5. The semiconductor circuit according to claim 1, wherein the signal processing circuit is a delay circuit.

6. A test apparatus comprising the semiconductor circuit according to claim 5, which provides a delay to an inputted clock.

7. The semiconductor circuit according to claim 1, wherein the signal processing circuit is an amplifier circuit.

8. A semiconductor circuit comprising:
    a first signal processing circuit that performs predetermined signal processing on a first signal to provide a change to a characteristic value thereof, and then outputs the signal as a second signal;
    a second signal processing circuit that performs predetermined signal processing on the second signal to provide a change to a characteristic value thereof, and then outputs the signal as a third signal;
    a first switching power supply that supplies a power supply voltage to the first signal processing circuit; and
    a second switching power supply that supplies a power supply voltage to the second signal processing circuit, wherein an amount of change provided to the characteristic value of the first signal by the first signal processing circuit, and an amount of change provided to the characteristic value of the second signal by the second signal processing circuit, are dependent on the respective power supply voltages, and wherein the first switching power supply and the second switching power supply operate in phases opposite to each other.

9. The semiconductor circuit according to claim 8, wherein the plurality of signal processing circuits have the same configuration.

10. The semiconductor circuit according to claim 8, wherein sensitivities of the amounts of change provided to characteristic values of signals by the plurality of signal processing circuits, respectively, on power supply voltages, are approximately equal to each other.

11. The semiconductor circuit according to claim 8, wherein the signal processing circuit is a delay circuit.

12. A semiconductor circuit comprising:
    a plurality of signal processing circuits that are connected in a cascade arrangement, each of which performs signal processing of the same type on an inputted signal to provide a change to a characteristic value of the signal; and
    a plurality of switching power supplies provided for the respective signal processing circuits to supply a power supply voltage to the corresponding signal processing circuits, wherein amounts of change provided to characteristic values of signals by the plurality of signal processing circuits are dependent on the respective power supply voltages, and wherein phases of the plurality of the switching power supplies are set such that a total of amounts of change provided to the characteristic values of signals by the plurality of the signal processing circuits is equal to its target value.

13. The semiconductor circuit according to claim 12, wherein, when there are n (n is an integer of two or more) pieces of signal processing circuits, each phase of the plurality of switching power supplies is shifted by 360/n degree relative to each other.

14. The semiconductor circuit according to claim 12, wherein the plurality of signal processing circuits have the same configuration.

15. The semiconductor circuit according to claim 12, wherein sensitivities of the amounts of change provided to characteristic values of signals by the plurality of signal processing circuits, respectively, on power supply voltages, are approximately equal to each other.

16. The semiconductor circuit according to claim 12, wherein the signal processing circuit is a delay circuit.

17. A semiconductor circuit comprising:
    a plurality of signal processing circuits that are connected in a cascade arrangement, each of which performs signal processing of the same type on an inputted signal to provide a change to a characteristic value of the signal; and a plurality of switching power supplies provided for the respective signal processing circuits to supply a power supply voltage to the corresponding signal processing circuits, wherein amounts of change provided to the characteristic values of signals by the plurality of signal processing circuits are dependent on the respective power supply voltages, and wherein, when there are n (n is an integer of two or more) pieces of signal processing circuits, each phase of the plurality of switching power supplies is shifted by 360/n degree relative to each other.

18. The semiconductor circuit according to claim 17, wherein the plurality of signal processing circuits have the same configuration.

19. The semiconductor circuit according to claim 17, wherein sensitivities of the amounts of change provided to characteristic values of signals by the plurality of signal processing circuits, respectively, on power supply voltages, are approximately equal to each other.

20. The semiconductor circuit according to claim 17, wherein the signal processing circuit is a delay circuit.

* * * * *